United States Patent
Hsu et al.

(10) Patent No.: US 7,348,280 B2
(45) Date of Patent: Mar. 25, 2008

(54) METHOD FOR FABRICATING AND BEOL INTERCONNECT STRUCTURES WITH SIMULTANEOUS FORMATION OF HIGH-K AND LOW-K DIELECTRIC REGIONS

(75) Inventors: Louis Lu-Chen Hsu, Fishkill, NY (US); Jack Allan Mandelman, Flat Rock, NC (US); William Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 302 days.

(21) Appl. No.: 11/266,741

(22) Filed: Nov. 3, 2005

(65) Prior Publication Data

US 2007/0096319 A1    May 3, 2007

(51) Int. Cl.
    *H01L 21/469* (2006.01)
(52) U.S. Cl. ............... 438/778; 438/780; 438/942; 257/E21.235
(58) Field of Classification Search ........... 438/778, 438/780, 942; 257/21.235
    See application file for complete search history.

(56) References Cited

U.S. PATENT DOCUMENTS

| 5,949,143 | A | 9/1999 | Bang |
| 6,104,077 | A | 8/2000 | Gardner et al. |
| 6,329,279 | B1 | 12/2001 | Lee |
| 6,440,839 | B1 | 8/2002 | Partovi et al. |
| 6,635,967 | B2 | 10/2003 | Chang et al. |
| 6,903,001 | B2* | 6/2005 | Bhattacharyya et al. .... 438/622 |
| 7,018,918 | B2* | 3/2006 | Kloster et al. ............ 438/623 |
| 2007/0212872 | A1* | 9/2007 | Daubenspeck et al. ..... 438/620 |

* cited by examiner

*Primary Examiner*—Michael Lebentritt
*Assistant Examiner*—Grant S Withers
(74) *Attorney, Agent, or Firm*—Joan Pennington

(57) ABSTRACT

A method for fabricating and back-end-of-line (BEOL) metalization structures includes simultaneous high-k and low-k dielectric regions. An interconnect structure includes a first inter-level dielectric (ILD) layer and a second ILD layer with the first ILD layer underlying the second ILD layer. A plurality of columnar air gaps is formed in the first ILD. The columnar air gap structure is created using a two-phase photoresist material for providing different etching selectivity during subsequent processing.

8 Claims, 12 Drawing Sheets

800

900

1000

100 nm

METHOD FOR FABRICATING AND BEOL INTERCONNECT STRUCTURES WITH SIMULTANEOUS FORMATION OF HIGH-K AND LOW-K DIELECTRIC REGIONS

FIELD OF THE INVENTION

The present invention relates generally to the field of manufacturing semiconductor devices, and more particularly, relates to a method of fabricating and back-end-of-line (BEOL) metalization structures for semiconductor devices including selective formation of simultaneous high dielectric constant (high-k) and low-k dielectric regions.

DESCRIPTION OF THE RELATED ART

In order to reduce the BEOL interconnect circuit delays resulting from parasitic capacitance between interconnect lines, conventional silicon dioxide dielectric, having a dielectric constant value k of approximately 4.0 forming the inter-level dielectric (ILD) and gap fill has been replaced with dense lower-k films, having dielectric constant values k of approximately 3.0. For further performance improvements for advanced devices, additional dielectric capacitance reduction is required, for example a dielectric constant value k of less than 2.5.

On the other hand, for applications requiring high capacitance, for example charge storage, and decoupling, high-k material with a dielectric constant value k of greater than 7 is preferred.

From a high-volume manufacturability and low cost point of view, a need exists for a single BEOL integration scheme for fabricating both low-k and high-k contained interconnects.

Capacitance reduction can be achieved with new porous low-k dielectrics; however, most of the porous materials have relatively weak mechanical properties as compared to dense dielectrics. It is also a significant challenge for the current BEOL process to integrate these materials with other module processes.

For example, conventional polishing processes, such as a chemical mechanical polishing (CMP) process conventionally used in a damascene metalization process have difficulty polishing low mechanical strength-porous dielectric. Also, conventional physical vapor deposition (PVD) diffusion barrier deposition technology does not offer reasonable coverage on surfaces of porous dielectrics.

Various techniques have been proposed to form air gaps with a plasma assisted etching process, for example with a reactive ion etching (RIE) process.

A need exists for an effective mechanism for implementing BEOL metalization structures for semiconductor devices including simultaneous high dielectric constant (high-k) and low-k dielectric materials.

SUMMARY OF THE INVENTION

Principal aspects of the present invention are to provide a method and back-end-of-line (BEOL) metalization structures for semiconductor devices including simultaneous high-k and low-k dielectric materials. Other important aspects of the present invention are to provide such method and back-end-of-line (BEOL) metalization structures for semiconductor devices including simultaneous high-k and low-k dielectric materials substantially without negative effect and that overcome many of the disadvantages of prior art arrangements.

In brief, a method for fabricating and back-end-of-line (BEOL) metalization structures are provided for semiconductor devices including simultaneous high-k and low-k dielectric materials. An interconnect structure includes a first inter-level dielectric (ILD) layer and a second ILD layer with the first ILD layer underlying the second ILD layer. A plurality of columnar air gaps is formed in the first ILD.

In accordance with features of the invention, the columnar air gap structure is created using a two-phase photoresist material for providing different etching selectivity during subsequent processing, such as subsequent reactive ion etching (RIE) processing. To enhance the etching selectivity one phase of the two-phase photoresist material optionally is removed before RIE processing. The two-phase photoresist material includes, for example, two different polymers, or a combination of a polymer and silicon oxide.

In accordance with features of the invention, selective cap formation is used to create local topography, and create two different surfaces including a metallic cap surface and dielectric hard mask (HM) surface. A material such as a dielectric hard mask (HM) layer extends over the first ILD layer and an exposed surface of an interconnect conductor is selectively capped with a metallic layer. The two-phase photoresist material is deposited over a surface of the dielectric HM layer and metallic cap. A two-phase separated photoresist material pattern is transferred to the first ILD layer to create the columnar air gap structure. Then a second insulator is deposited on the patterned wafer surface.

In accordance with features of the invention, the deposited second insulator material optionally fills the columnar air gap structure in the first ILD layer for applications requiring high capacitance. For other high-speed applications, the deposited second insulator material does not fill the columnar air gap structure, leaving air gaps in the ILD layer in the final interconnect structure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a capacitance modification method is provided for modern semiconductor devices in both high-k and low-k interconnect applications. The capacitance modification method is quickly and easily integrated with present BEOL processes. Neither exotic nor new materials are required. Either an air gap structure or a high-k material can be embedded inside an original inter-level dielectric material. The method is compatible with the current BEOL process flow, and does not require new module development for optimizing etch profiles, improving barrier coverage, or handling CMP processes.

In accordance with features of the preferred embodiments, an interconnect structure containing air gaps inside a dielectric material is provided for overall BEOL capacitance reduction. Also an interconnect structure containing a high-k material embedded in the original dielectric is provided for overall BEOL capacitance increase. Methods of forming the low-k BEOL interconnect structure are provided.

Having reference now to the drawings, in FIGS. 1, 2, 3A, 4, 5, 6, and 7, there are shown exemplary process steps for fabricating interconnect structures in accordance with the preferred embodiments.

Figure 1:
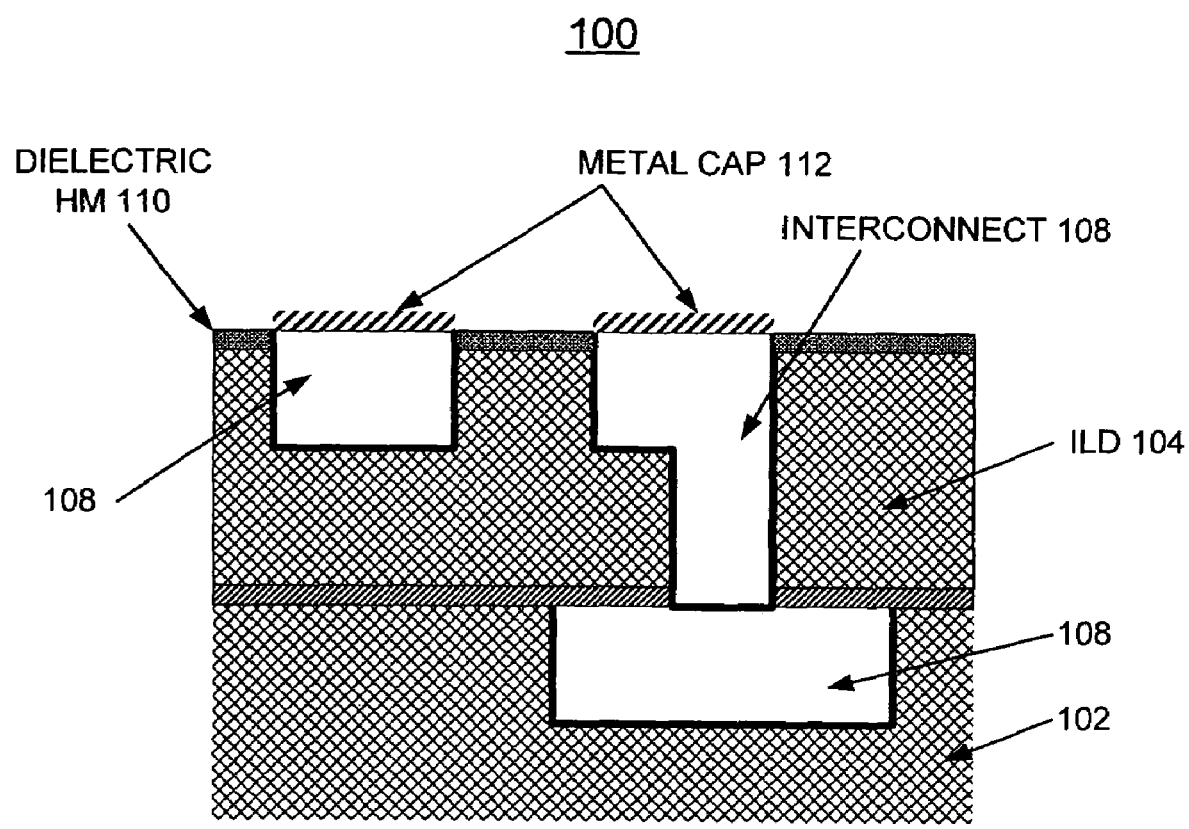
FIGS. 1, 2, 3A, 3B, 4, and 5 illustrate exemplary process steps for fabricating interconnect structures in accordance with the preferred embodiments.

In FIG. 1, a first processing step generally designated by the reference character 100 begins with selective cap formation in accordance with the preferred embodiment. In the first processing step 100, selective cap formation is used to create local topography, and create two different surfaces including a metallic cap surface and dielectric hard mask (HM) surface.

As shown an initial structure for the first processing step 100 includes a substrate layer 102 underlying a first interlevel dielectric (ILD) layer 104 and a plurality of conductors 108. An interface material 110 or dielectric hard mask (HM) layer 110 is provided over the exposed first ILD layer 104. An exposed surface of each interconnect conductor 108 extending through the dielectric HM layer 110 is selectively capped with a metallic layer or metal cap 112.

The first ILD layer 104 is a low-k material and has preferably a thickness between 50 nm and 1000 nm. For example, the first ILD layer 104 is a material selected from the group consisting of silicon containing materials such as SiOF (FSG), SiCOH, HSQ (hydrogen silsesquioxane polymer), and MSQ (methyl silsesquioxane polymer), or organics such as parylene, BCB, polyphenylene oligomer, fluorocarbons, and combinations thereof.

The conductors 108 are formed of any suitable electrically conductive material, for example, of Cu, Al, Al (Cu), and W. The HM layer 110 provides, for example, a hydrophilic surface for subsequent local selective phase separation. The thickness of the HM layer 110 is between 2 nm and 80 nm. The HM layer 110 can be conductor, insulator, or semiconductor.

For example, the exposed surface of the copper conductors 108 is selectively capped with the cap layer 112 formed of COWP, which serves both as a passivation and Cu diffusion barrier layer. Preferably, the thickness of the CoWP layer 112 is between 5 nm and 30 nm. In addition to CoWP, other materials such as CoSnP, CoP, CoB, CoSnB, COWB, Pd, and Ru are also good candidates to form the cap layer 112. It is preferred that the material forming the cap layer 112 has a hydrophobic surface for later random phase formation with the hydrophilic surface provided by the dielectric HM layer 110.

Figure 2:
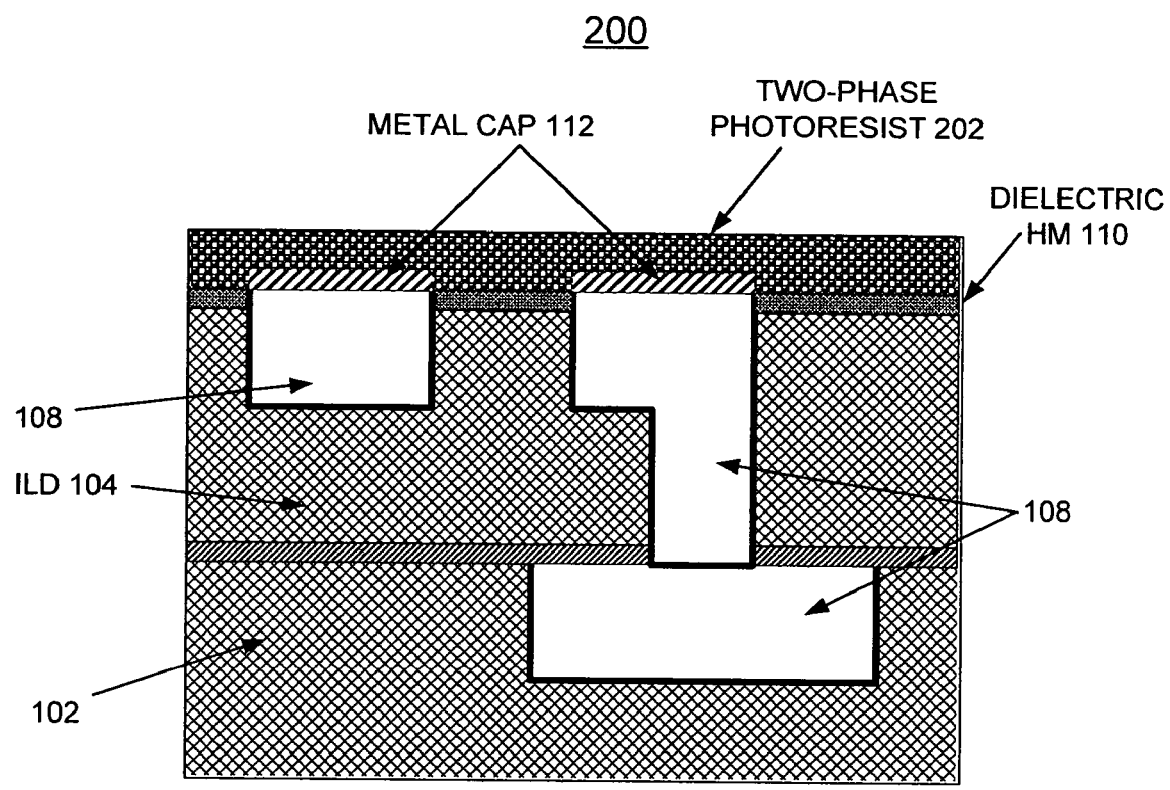

Referring to FIG. 2, in a next processing step generally designated by the reference character 200 a two-phase photoresist 202 is deposited on the wafer surface. The photoresist layer 202 has preferably a thickness between 20 nm and 500 nm. The two-phase photoresist 202 can be formed, for example, of two different polymers, or by a combination of a polymer and silicon oxide.

Figure 3A:
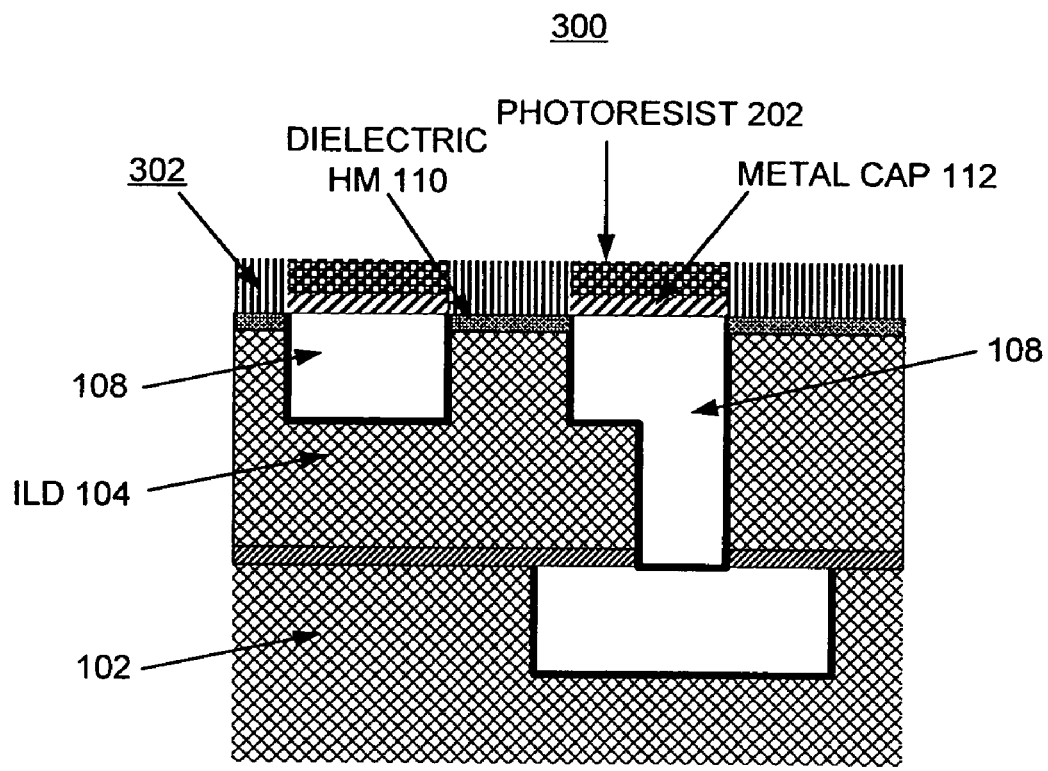
Figure 3B:
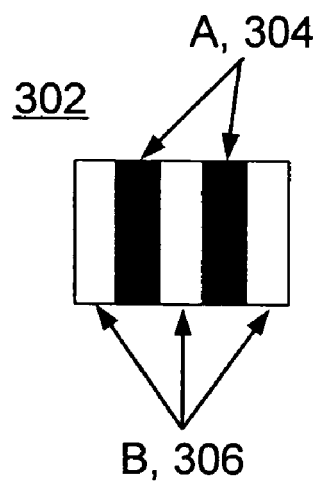

Referring to FIGS. 3A and 3B, in a next processing step generally designated by the reference character 300, phase separation of the two-phase photoresist material 202 is performed. The phase separation of the two-phase photoresist material 202 only occurs locally in a region generally designated by the reference character 302 on top of the dielectric HM layer 110 into a phase A, 304 and a phase B, 306. FIG. 3B is a fragmentary detail view illustrating resulting phases A, B of the phase-separated region 302 from the phase separation step 300.

Two different phase materials have different etching selectivity, for example phase A 304 has higher etching-resistance than phase B, 306. The phase separation only happens locally on top of dielectric HM layer 110. The topography features on the existing wafer or different interface properties, between the two-phase photoresist 202 and the HM layer 110 and between the two-phase photoresist 202 and the metallic cap layer 112, advantageously initiate this local phase separation.

For enhanced subsequent etching selectivity, phase B, 306 optionally may be removed from the wafer surface before the next process. The removal step can be achieved by wet, plasma, or other chemical related processes.

Figure 4:
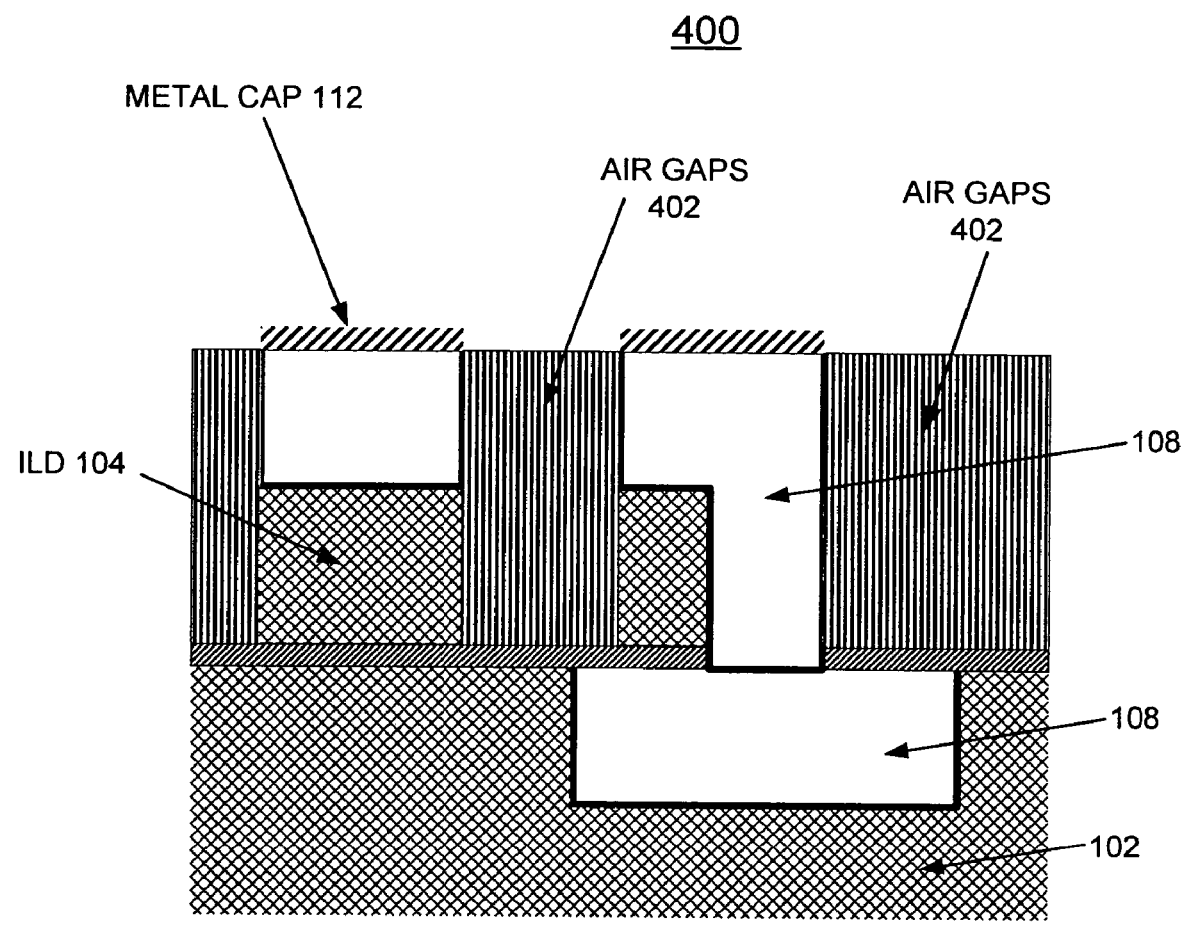

Referring to FIG. 4, a next processing step generally designated by the reference character 400 provides a pattern transfer from the photoresist phase-separated regions 302 into the underlying first ILD layer 104 through a RIE process. A resulting columnar air gap structure 402 is shown.

It should be understood that the above resist-deposition, phase-separation, and RIE processes optionally may be repeated in different orientations for creating a structure with a net of air gaps in order to further reduce the final dielectric capacitance.

Figure 5:
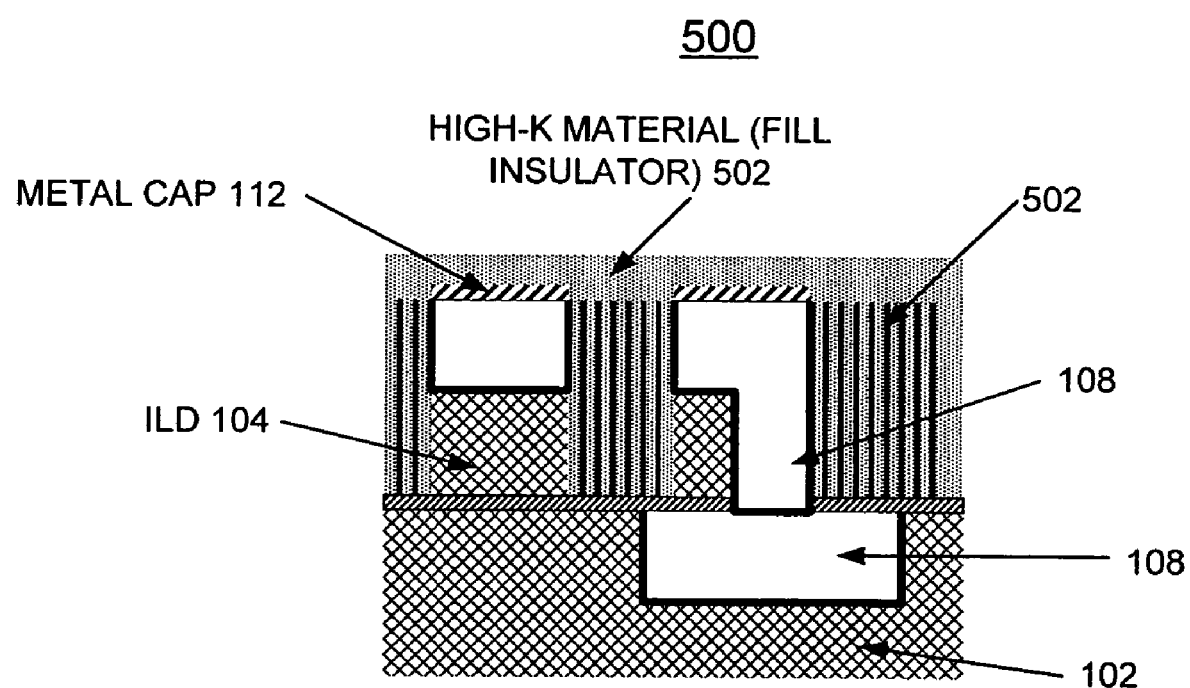

Referring to FIG. 5, in a next processing step generally designated by the reference character 500 a fill insulator material 502 is then deposited on the wafer surface for further processing. The deposition technique can be chemical vapor deposition (CVD), atomic level deposition (ALD), or spin-on related processes. Preferably, the second insulator 502 is a high-k material. The fill insulator material 502 is formed for example, of a high-k material, metal oxide, Ta2O5, BaTiO3, HfO2, ZrO2, Al2O3, metal silicates, HfSixOy, HfSixOyNz and combinations thereof. The fill insulator material 502 is formed for example, of a material selected from the group consisting of silicon dioxide, silicon nitride, silicon carbide, silicon oxy nitride, silicon oxy carbide, hydrogen doped silica glass, and plasma-enhanced silicon nitride. As shown in FIG. 5, the deposited fill insulator material 502 fills the air gaps inside previously formed columnar air gap structure 402 containing ILD 104.

Preferably a blocking layer is deposited and patterned prior to the deposition of the fill insulator material 502. The purpose of the blocking layer is to selectively protect those air gap regions 402 intended to remain unfilled, while providing openings which allow fill insulating material 502 to fill the air gaps 402, as described above. The blocking layer material may comprise silicon nitride or other suitable material, which is deposited such that the openings to the columnar air gaps are sealed. Following filling of the exposed air gaps 402 with second insulator material 502, as described above, the blocking layer may be removed by selective etching. Optionally, the removal of the blocking layer may be masked to provide regions where the blocking layer remains. Thus at this stage of processing, selective regions of ILD 104 have been converted to high-K dielectric, while other portions of the surface contain open air gaps 402.

Figure 6:
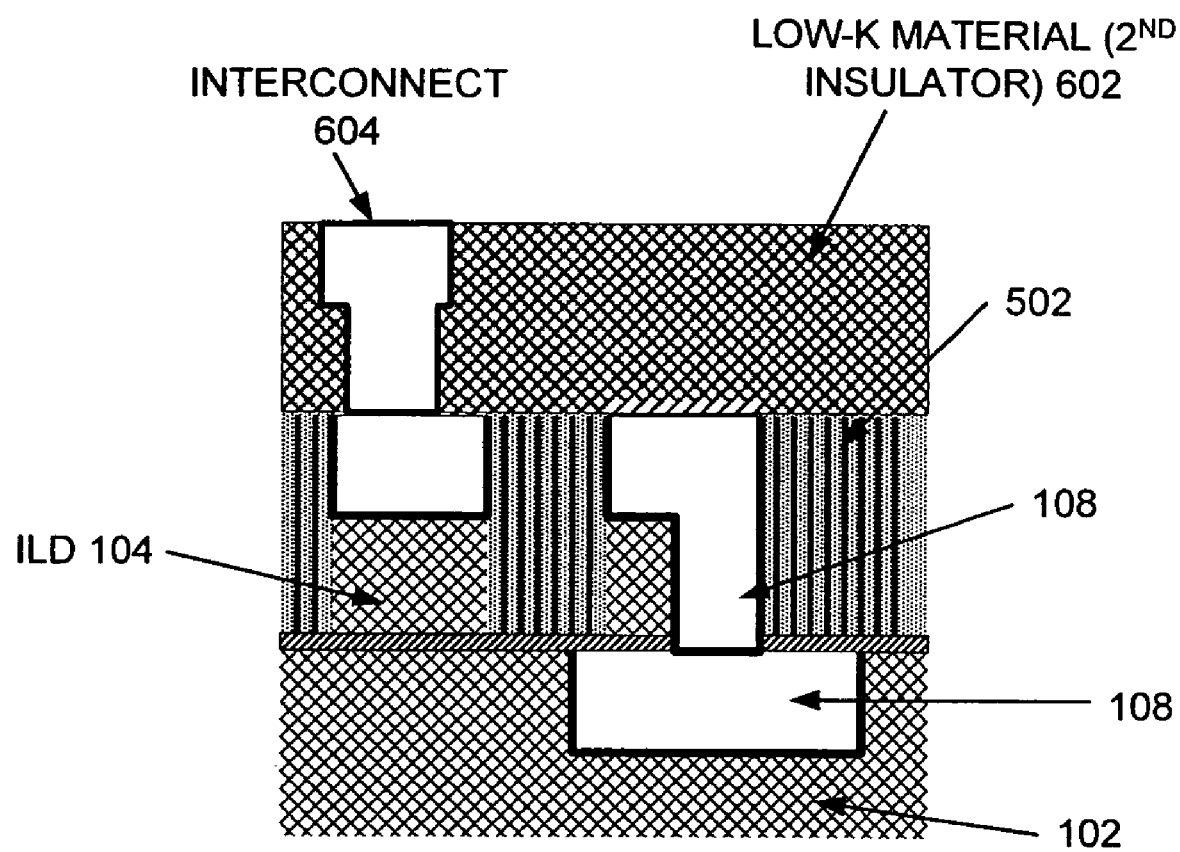
FIGS. 6 and 7 are schematic side views not to scale illustrating alternative exemplary interconnect structures in accordance with the preferred embodiments.

FIG. 6 illustrates a next processing step generally designated by the reference character 600 following the deposition of the fill insulator material 502 and removal of the high-k insulator material 502 from the wafer surface. In step 600, a second insulator material 602 is then deposited on the wafer surface for further processing. As shown in FIG. 6, an interconnect conductor 604 is embedded in the second insulator material 602. The deposition technique can be CVD, ALD, or spin-on related processes. Preferably, the second insulator 602 is a low-k material forming a second ILD layer. The second ILD layer 602 is formed for example, of a low-k material, silicon containing materials such as SiOF (FSG), SiCOH, HSQ (hydrogen silsesquioxane polymer), and MSQ (methyl silsesquioxane polymer), or organics such as parylene, BCB, polyphenylene oligomer, fluorocarbons, and combinations thereof. FIG. 6 illustrates a preferred final structure for capacitor or high-capacitance required devices.

Figure 7:
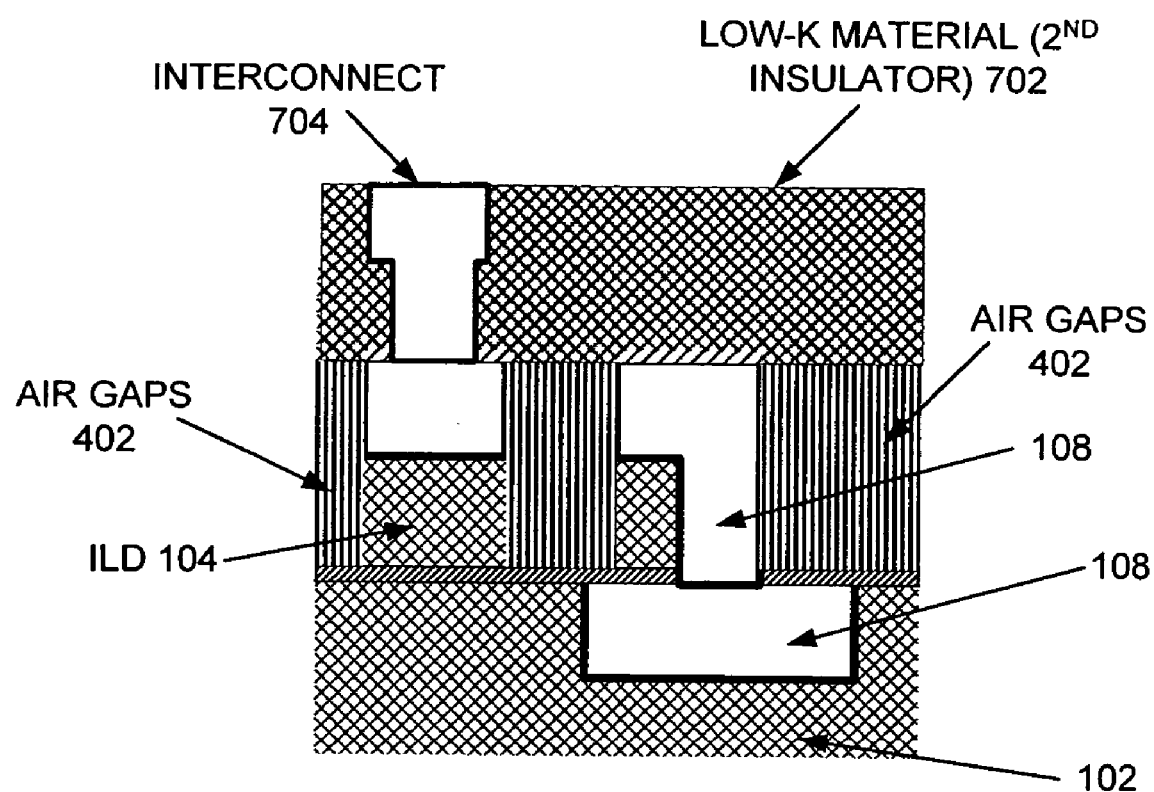

Referring to FIG. 7, in an alternative next processing step generally designated by the reference character 700 following step 400 in FIG. 4. In processing step 700, a second insulator material 702 is then deposited on the wafer surface for further processing. As shown in FIG. 7, an interconnect conductor 704 is embedded in the second insulator material 702. FIG. 7 illustrates a preferred final structure for high-speed device applications. The deposition technique can be CVD, ALD, or spin-on related processes. Preferably, the second insulator 702 is a low-k material forming a second ILD layer. The second ILD layer 702 is formed for example, of a low-k material, silicon containing materials such as SiOF (FSG), SiCOH, HSQ (hydrogen silsesquioxane polymer), and MSQ (methyl silsesquioxane polymer), or organics such as parylene, BCB, polyphenylene oligomer, fluorocarbons, and combinations thereof. As shown in FIG. 7, the deposited second insulator 702 does not fill the air gaps inside the columnar air gap structure 402, and leaves air gaps in the final structure and the second insulator material 702 seals the openings to air gaps 402.

In accordance with features of the preferred embodiments, an advantage of the present invention as compared to the prior art is that the air gap structure is formed compatibly with current Cu dual damascene processing, without the need for additional critical masking. When both low-k and high-k regions are to be formed in the same BEOL, only a non-critical block mask is needed. Prior art techniques require additional critical masks. The process cost imposed by the present invention is lower than prior art techniques.

Figure 8A:
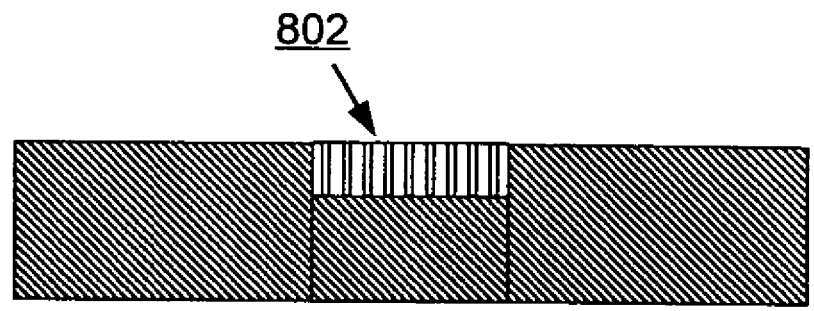
FIGS. 8A and 8B illustrate exemplary phase separation features in accordance with the preferred embodiments.
Figure 8B:
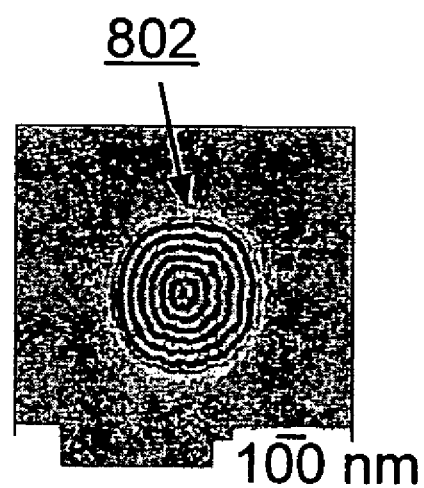
Figure 9A:
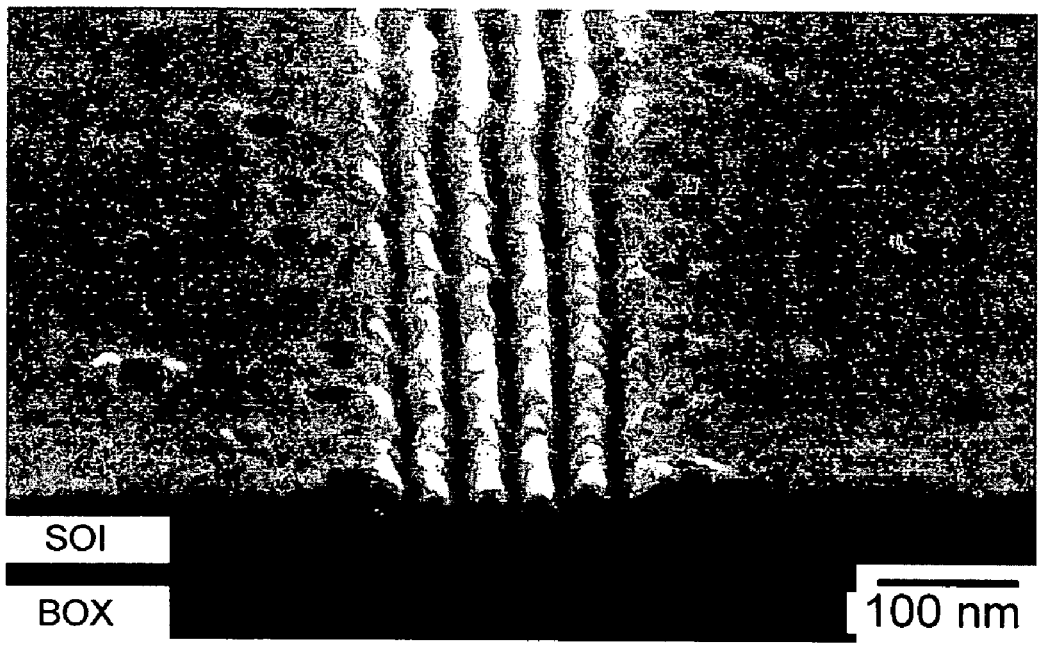
FIGS. 9A, 9B, and 9C and 10A, 10B, and 10C illustrate exemplary interconnect structures fabricated in accordance with the preferred embodiments.
Figure 9B:
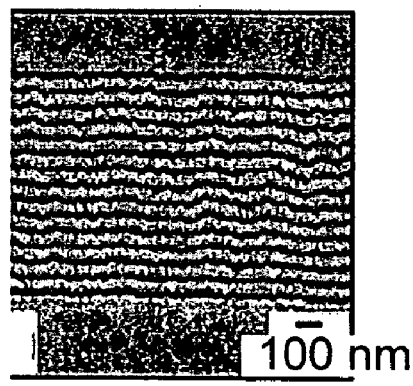
Figure 9C:
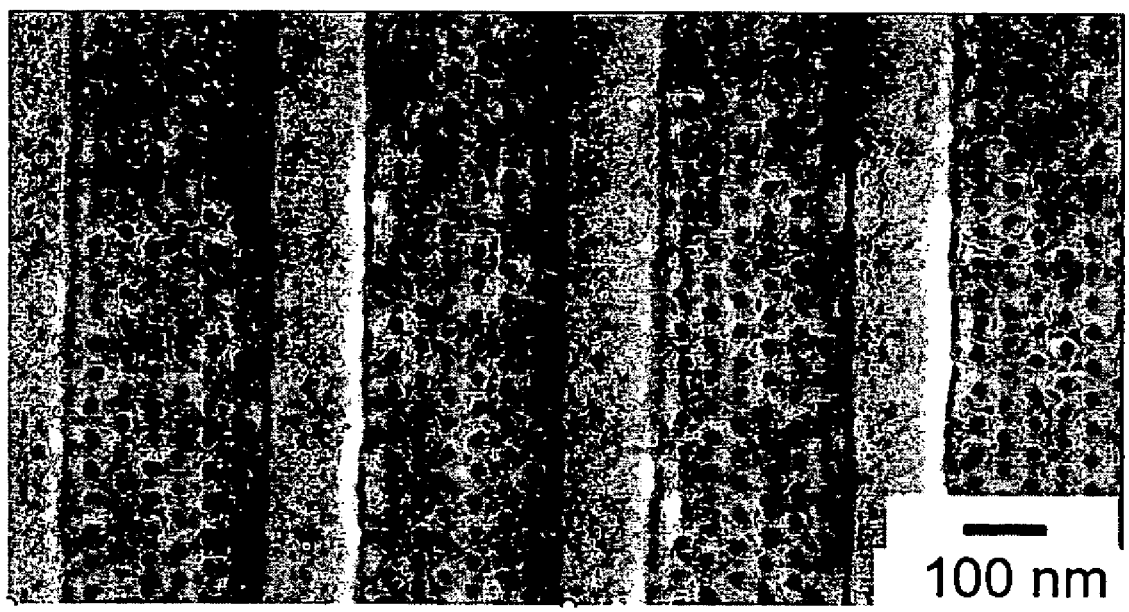
Figure 10A:
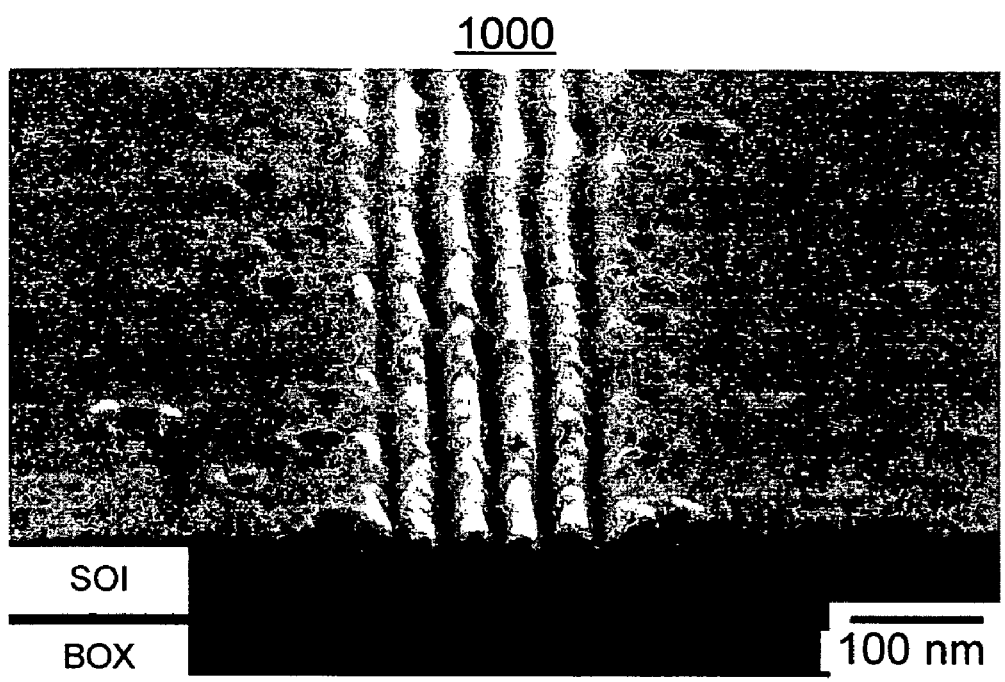
Figure 10B:
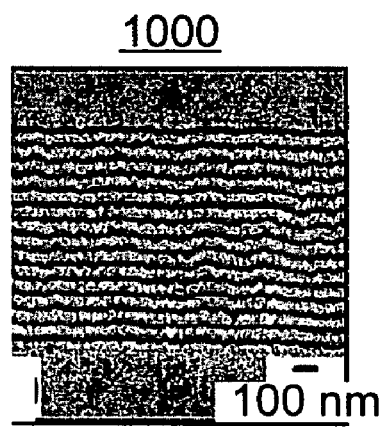
Figure 10C:
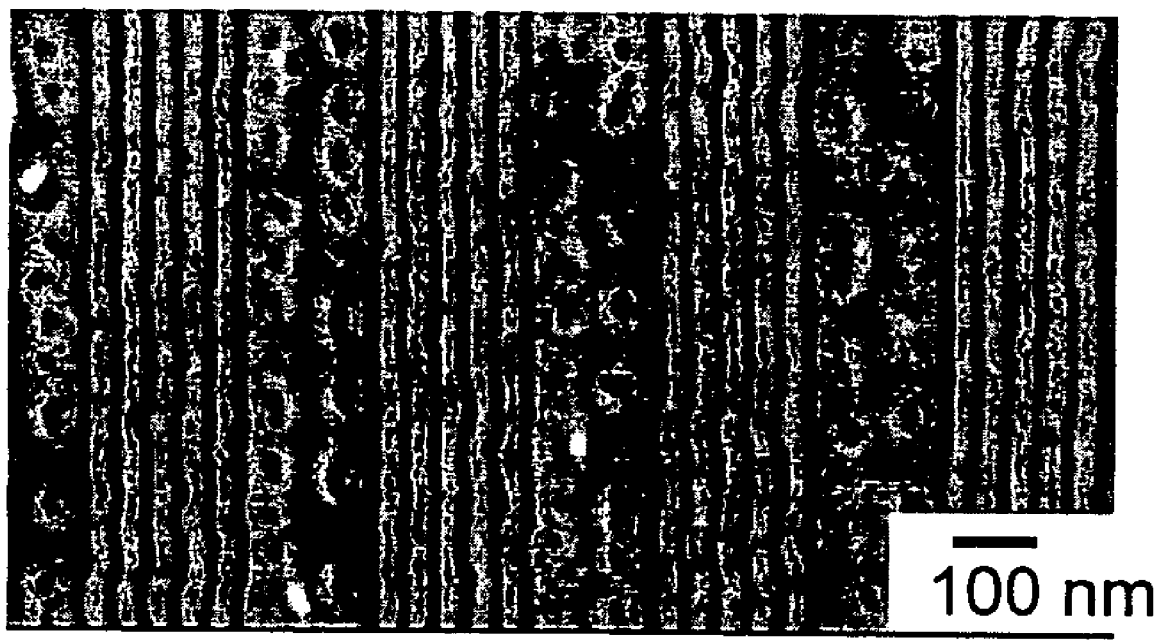

Referring also to FIGS. 8A and 8B, there is shown an exemplary structure generally designated by the reference character 800 illustrating other exemplary phase separation features 802 fabricated in accordance with the preferred embodiments.

Referring now to FIGS. 9A, 9B, and 9C and 10A, 10B, and 10C respectively illustrate an exemplary interconnect structure generally designated by the reference character 900 and 1000 fabricated in accordance with the preferred embodiments.

While the present invention has been described with reference to the details of the embodiments of the invention shown in the drawing, these details are not intended to limit the scope of the invention as claimed in the appended claims.

What is claimed is:

1. A method for fabricating a back-end-of-line (BEOL) interconnect structure comprising the steps of:
   providing a first inter-level dielectric (ILD) layer; said first ILD layer underlying a dielectric hard mask (HM) layer, and an interconnect conductor extending through said dielectric hard mask (HM) layer into said first ILD layer;
   providing selective cap formation to create a metallic cap surface on said interconnect conductor and a dielectric HM surface;
   depositing a two-phase photoresist material over said dielectric HM surface and said metallic cap surface;
   wherein a phase separation of said two-phase photoresist material is formed by an interaction of said two-phase photoresist and said dielectric hard mask (HM) layer and said two-phase photoresist and said metallic cap layer;
   depositing a two-phase separated photoresist material pattern to the first ILD layer to create a columnar air gap structure; and
   depositing an insulator material for forming a second ILD layer.

2. A method for fabricating a back-end-of-line (BEOL) interconnect structure as recited in claim 1 wherein creating said columnar air gap structure includes a BEOL dual damascene process without requiring any additional critical masks.

3. A method for fabricating a back-end-of-line (BEOL) interconnect structure as recited in claim 1 wherein said deposited two-phase photoresist material provides different etching selectivity for reactive ion etch (RIE) processing.

4. A method for fabricating a back-end-of-line (BEOL) interconnect structure as recited in claim 1 further includes depositing a fill insulator material to fill said columnar air gap structure in the first ILD layer for applications requiring high capacitance; said fill insulator material being deposited before depositing said insulator material for forming said second ILD layer.

5. A method for fabricating a back-end-of-line (BEOL) interconnect structure as recited in claim 1 wherein said deposited second insulator material does not fill said columnar air gap structure, leaving air gaps in said first ILD layer for high-speed applications.

6. A method for fabricating a back-end-of-line (BEOL) interconnect structure as recited in claim 1 wherein said two-phase photoresist material includes two different polymers.

7. A method for fabricating a back-end-of-line (BEOL) interconnect structure as recited in claim 1 wherein said two-phase photoresist material includes a combination of a polymer and silicon oxide.

8. A method for fabricating a back-end-of-line (BEOL) interconnect structure as recited in claim 1 wherein said second ILD layer is formed by a selected one of chemical vapor deposition (CVD), atomic level deposition (ALD), or spin-on related processes.

* * * * *